United States Patent
Murray et al.

(10) Patent No.: US 7,221,142 B2
(45) Date of Patent: May 22, 2007

(54) MEASURING DEVICES

(75) Inventors: Martin Anthony Murray, Bangor (GB); Mark David Crosier, Isle of Anglesey (GB); Brian Martin Reeder, Austin, TX (US)

(73) Assignee: Eaton Electric Limited, Manchester (GB)

( * ) Notice: Subject to any disclaimer, the term of this patent is extended or adjusted under 35 U.S.C. 154(b) by 308 days.

(21) Appl. No.: 10/480,090

(22) PCT Filed: Jun. 7, 2002

(86) PCT No.: PCT/GB02/02643

§ 371 (c)(1),
(2), (4) Date: Jan. 31, 2005

(87) PCT Pub. No.: WO02/101397

PCT Pub. Date: Dec. 19, 2002

(65) Prior Publication Data

US 2005/0212505 A1 Sep. 29, 2005

(30) Foreign Application Priority Data

Jun. 8, 2001 (GB) .................. 0113941.9

(51) Int. Cl.
*G01R 15/20* (2006.01)
*G01R 31/02* (2006.01)
*H02H 3/00* (2006.01)

(52) U.S. Cl. .................. 324/117 R; 324/421; 361/42

(58) Field of Classification Search .................. 361/42; 324/117 R, 126, 421
See application file for complete search history.

(56) References Cited

U.S. PATENT DOCUMENTS 3,024,389 A * 3/1962 Van Cortlandt Warrington .................. 361/80

(Continued)

FOREIGN PATENT DOCUMENTS

EP 0540379 9/1992

(Continued)

*Primary Examiner*—Stephen W. Jackson
*Assistant Examiner*—Boris Benenson
(74) *Attorney, Agent, or Firm*—David C. Jenkins; Kirk D. Houser; Eckert Seamans Cherin & Mellott, LLC

(57) ABSTRACT

A combined toroid/shunt device for detecting residual current in an electrical installation comprising a plurality of conductors such as a live conductor (2) and a neutral conductor (3) is described. The device comprises a toroid means (1, 4) for detecting an AC residual current within a first range and a plurality of resistive shunts (6a) to (6d) for connection in respective ones of the plurality of conductors. A current detection means (5, 7, 13) responsive to current flowing in each of said shunts for detecting a DC residual current and/or an AC residual current within a second range is described. The first range of AC residual current is an AC residual current resulting from earth leakage or cross-leakage between conductors up to a saturation level at which the toroid or electronic means associated means therewith becomes saturated. The second range includes an AC residual current of said saturation level.

15 Claims, 3 Drawing Sheets

U.S. PATENT DOCUMENTS

| | | | |
|---|---|---|---|
| 4,068,276 A * | 1/1978 | Pintell ........................ 361/46 |
| 4,278,938 A | 7/1981 | Morriss |
| 4,420,721 A | 12/1983 | Dorey et al. |
| 5,701,253 A * | 12/1997 | Mayell et al. ................ 702/60 |
| 6,018,700 A | 1/2000 | Edel |
| 6,058,354 A * | 5/2000 | Adame et al. ................ 702/60 |
| 6,646,430 B1 * | 11/2003 | Skerritt et al. .............. 324/126 |
| 6,788,067 B1 * | 9/2004 | Skerritt et al. .............. 324/421 |
| 6,791,315 B2 * | 9/2004 | Skerritt et al. .............. 324/126 |

FOREIGN PATENT DOCUMENTS

| | | |
|---|---|---|
| FR | 2 430 680 | 3/1980 |
| FR | 2 590 030 | 5/1987 |
| GB | 2178915 | 2/1987 |
| GB | 2295284 | 5/1996 |

* cited by examiner

MEASURING DEVICES

This invention relates to measuring devices for electrical installations, and in particular to measuring devices including a current/voltage detection module for analysing current and voltage to facilitate, inter alia, a residual current detection and power consumption.

A method of detecting for residual current may involve using a current transformer having primary windings through which, in the case of a single phase device, load current flows in opposite directions so that if the return current is different from the outwardly flowing current because of current leakage, an output current signal is induced in a secondary winding of the transformer. In the case of a multi-phase device, primary windings of the transformer are connected in all of the phase lines and the neutral line. In normal situations, when there is no current leakage, the net current induced in the secondary winding is zero and therefore no output is detected. These devices are subject to nuisance tripping arising from surges in the supply, switches in appliances and the like. Further problems arise because the transformer is designed to be sensitive to very small current imbalances caused by current leakage. With relatively large current leakage faults, the magnetic flux may cause the transformer core to become saturated and so fail to induce a current in the secondary winding. Alternatively, a large induced current may cause saturation of an amplifier in the electronic circuit which is used to process the induced current signal.

Also, toroidal transformer devices may be insensitive to dc current leakage faults, such that the fault goes undetected and no trip occurs. Many electrical systems incorporate switching power supplies, for example ac to dc converters and inverters in motor speed control and start-up systems. In such systems the ac supply phases are switched electronically (for example with high voltage FETs) to provide rectified waveform signals. In such cases a current leakage fault may not induce sufficient current in the secondary winding to detect the fault.

One method of determining power consumption is to measure the voltage across the power supply wires and the current flowing through them and then multiply the current by the voltage measurement to determine a power measurement. One approach is to use a shunt of known value connected in series with one of the wires and to measure the voltage across and current flowing through it. Power meters include a counter or clock for measuring the number of watt-hours consumed. The counter or clock is periodically read manually in order that the consumer can be billed for the quantity of electricity used.

Shunt resistors could also be used to detect an imbalance in the current caused by a current leakage. However, to be useful on their own as a residual current detection safety device for tripping a circuit breaker, the shunt resistors would have to be extremely accurate. The current flowing through the shunts would need to be detected to an accuracy in the order of 1 to 10 mA in 100 A ($10^{-5}$ to $10^{-4}$). This means that sophisticated and complex measurement circuitry would be needed to provide the required resolution as well as precise and stable shunt resistors having linear resistance characteristics.

Conventionally, residual current devices and power consumption meters are separate discrete devices. The power consumption meter is usually located at the point of entry of the electricity supply into the premises and the residual current device is located within the consumer unit or fuse box from which the circuits to the premises are distributed.

It is an aim of the present invention to devise a combined residual current and power measuring device which overcomes or at least alleviates these problems. It is a further aim of the invention to devise a combined residual current and power measuring device which is less bulky than conventional devices and operates to an improved degree of sophistication such as to facilitate remote monitoring of the electrical installation.

According to a first aspect of the present invention, there is provided a measuring device for an electrical installation comprising a plurality of conductors, the device comprising toroid means for detecting a residual current and power consumption means comprising a shunt detector means for generating a current signal indicative of current detected in at least one of said conductors and a resistor detector means for generating a voltage signal indicative of voltage across at least one pair of said conductors.

In a preferred embodiment the electrical installation comprises$_{13}$ an ac supply via a neutral conductor and a live conductor, said toroid means comprising a toroidal transformer detector for generating a residual current signal in response to a detected residual current in said electrical installation, and said resistor detector means is provided for connection between said neutral and live conductors to generate said voltage signal by measuring the voltage drop across the resistor detector means or a potentially divided portion thereof, the device further comprising a processor means for generating a trip signal indicative of the presence of a residual current fault in dependence on said residual current signal, thereby to facilitate operation of a circuit breaker to break said ac supply in response to said trip signal, and an output signal derived from said current and voltage signals to facilitate determination of power consumption.

In another preferred embodiment, the ac supply may comprise a plurality of phases, each phase comprising a supply via a phase live conductor and said neutral conductor, wherein the shunt detector means comprises a respective shunt connected in series in each of said phase live conductors for providing a respective current signal indicative of the current flowing in the respective phase live conductor, and said resistor detector means comprises a respective resistor means connected between each of said phase live conductors and said neutral conductor, said processor being operative for generating signals representative of the voltage between each phase live conductor and said neutral conductor by measuring the voltage across each of said resistor means or potentially divided portions thereof.

According to a second aspect of the present invention, there is provided a measuring device for an electrical installation having an ac supply via a neutral conductor and at least one live conductor, the device comprising a toroidal transformer detector for generating a residual current signal in response to a detected residual current in said electrical installation, a shunt resistor detector for generating respective current signals indicative of current detected in said neutral conductor and each of said at least one live conductors, a processor means for generating a trip signal indicative of the presence of a residual current fault in dependence on said residual current signal and/or said respective current signals detected, and a circuit breaker operative to break said ac supply in response to said trip signal.

In a preferred embodiment, for each of said at least one live conductors, the device may further comprise a resistor detector means for connection between said neutral and live conductors and operative for providing a signal representative of the voltage between said neutral and live conductors by measurement of the voltage drop across said resistor detector means or a potentially divided portion thereof.

In an embodiment of the invention, the processor means comprises a first analog to digital converter coupled to a secondary winding of said transformer for generating said residual current signal as a digital signal representative of the voltage sensed across the winding and/or the current in the winding.

The processor means may further comprise a second analog to digital converter coupled to the shunt resistor detector for generating digital signals representative of the current flowing through said neutral conductor and each of said at least one live conductors.

The first and/or second analog to digital converter may also be coupled to said resistor detector means for generating digital signals representative of said voltage between said neutral and live conductors.

Alternatively, the first and/or second analog to digital converters may include a multiplexer for selectively coupling two or more of said detector means and generating corresponding digital signals representative of the voltage or current detected.

Each analog to digital converter may include a delta-sigma modulator.

The processor means may include a microprocessor for receiving the digital signals from the first and second analog to digital converters for determining the power consumed by the electrical installation from the digital signals. The microprocessor may be further operative for generating a current imbalance signal indicative of the residual current during real time from the residual current signal. The microprocessor may be further operative for generating said current imbalance signal from a comparison of said current signals indicative of the current in said neutral and live conductors. The microprocessor may be further operative for generating said trip signal on the basis of a comparison of said current imbalance signal with a predetermined threshold criterion.

The microprocessor may be yet further operative for analysing the residual current, current and voltage in order to detect one or more other conditions, including, overcurrent, arc fault, standing current leakage, and "True power" measurement from the phase angle (Power=Voltage * Current * Cosine (Phi)). The power consumption, together with the other operating conditions or events may be logged for future reference. This information is useful for diagnostic purposes.

A temperature sensor may be provided to allow for compensation for temperature fluctuations in the shunts. The microprocessor may be calibrated to generate current and voltage signals taking into account the temperature of the shunts relative to a reference point.

The microprocessor may be arranged to adjust the threshold of the residual current necessary to generate a trip signal if it learns that the residual current is caused by a standing leakage at the installation. The residual current detector function will therefore continue to operate as a safety device while minimising the possibility of nuisance tripping. For example, if there were a standing leakage of 10 mA when the monitoring device is installed, the device would trip when the predetermined threshold is reached above the 10 mA level rather than zero.

A communication device may be provided for transmitting this information to a remote monitoring station.

According to another aspect of the present invention there is provided a combined toroid/shunt device for detecting a residual current in an electrical installation comprising a plurality of conductors, the device comprising: a toroid means for detecting an ac residual current in a first range; a plurality of resistive shunts for connection in respective ones of said plurality of conductors; and current detection means responsive to current flowing in each of said shunts for detecting a dc residual current and/or an ac residual current in a second range.

In a preferred embodiment the first range of ac residual current is an ac residual current resulting from earth leakage or cross-leakage between the conductors up to a saturation level at which the toroid or electronic means associated therewith become saturated, and the second range includes ac residual currents above said saturation level.

The conductors may comprise a live conductor and a neutral conductor. Alternatively the conductors may comprise a neutral conductor and a plurality of live conductors in an installation having a multi-phase supply.

It is evident that, in embodiments of the invention, the device is provided with two means for detecting a residual current. The toroidal transformer facilitates detection of a current imbalance between the neutral and live conductors, indicative of a residual current, from the voltage induced in the secondary winding. The toroidal transformer can detect a residual current of a very low level (10 mA or less). The shunt detector facilitates detection of a current imbalance from a comparison of the current detected in the neutral and live conductors. The shunt detector may thereby facilitate detection of a residual current even when the residual current arises from a dc fault, not detectable by the transformer. The shunt detector may also facilitate detection of residual current in circumstances where the magnetic flux causes the transformer to saturate.

It is evident that embodiments of the invention provide for an integral or combined power and residual current device. One advantage arising out of this is that the power meter, which is usually owned by the electricity supplier, may be owned by the user. Parameters relating to electricity usage and fault conditions are transmitted to a station monitored by the supplier for billing, diagnostic, consumption or service purposes. It is also apparent that a reduction in bulk relative to conventional power measuring and separate residual current devices is possible. This allows devices embodying the invention to be embedded in appliances to provide for trip avoidance, greater discrimination, failure indication and downstream monitoring. Sub-circuit metering may be effected particularly if the devices are networked, this enabling better discrimination and isolation of faults, tripping the sub-circuit first, before the main circuit trips. Further uses are envisaged such as providing warning data prior to tripping and use in building management systems.

The invention will now be further described by way of example with reference to the accompanying drawings, in which.

Figure 1:
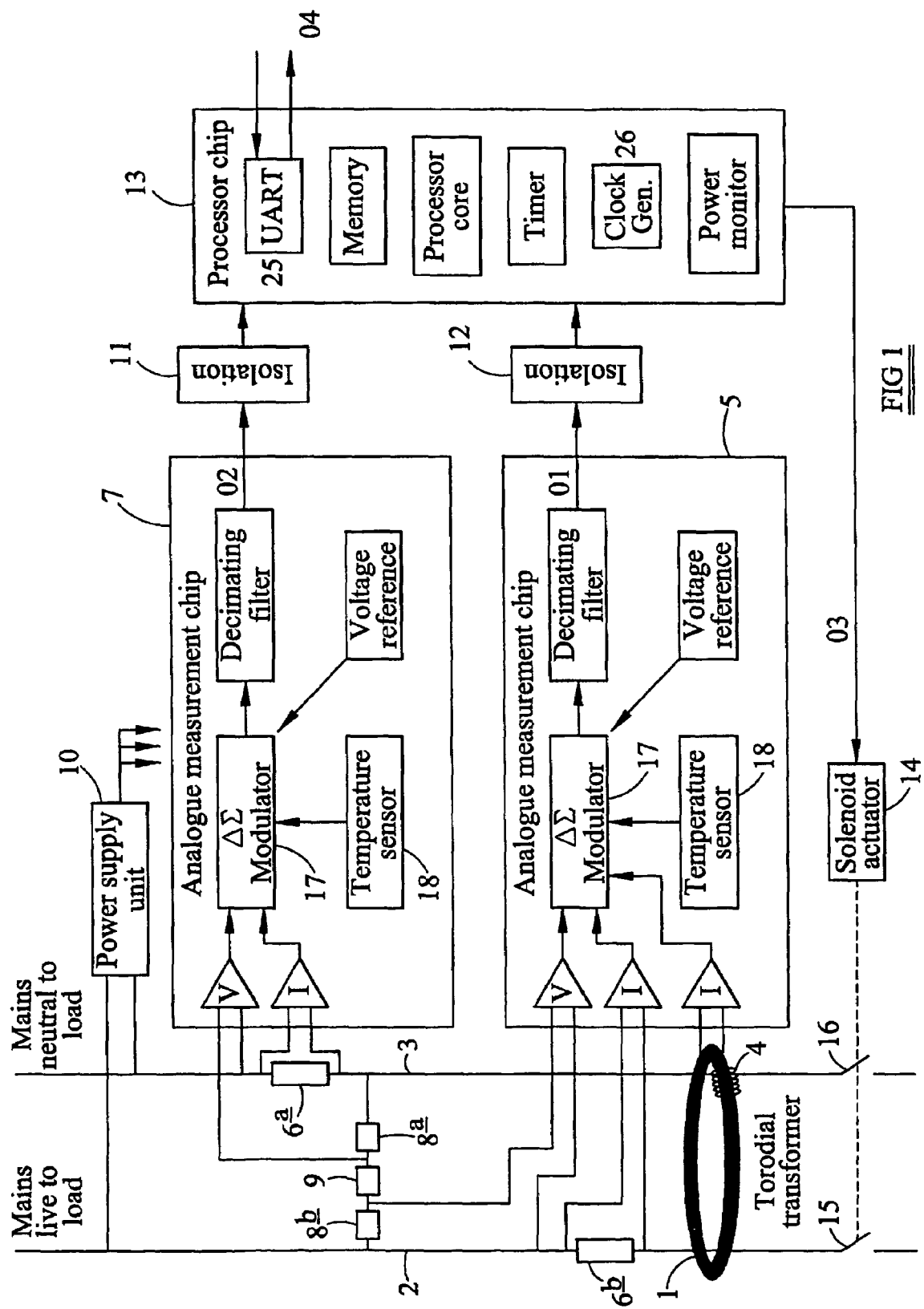
FIG. 1 is a block diagram of a combined power meter and residual current device embodying the present invention applied to a single phase electricity supply.
Figure 2:
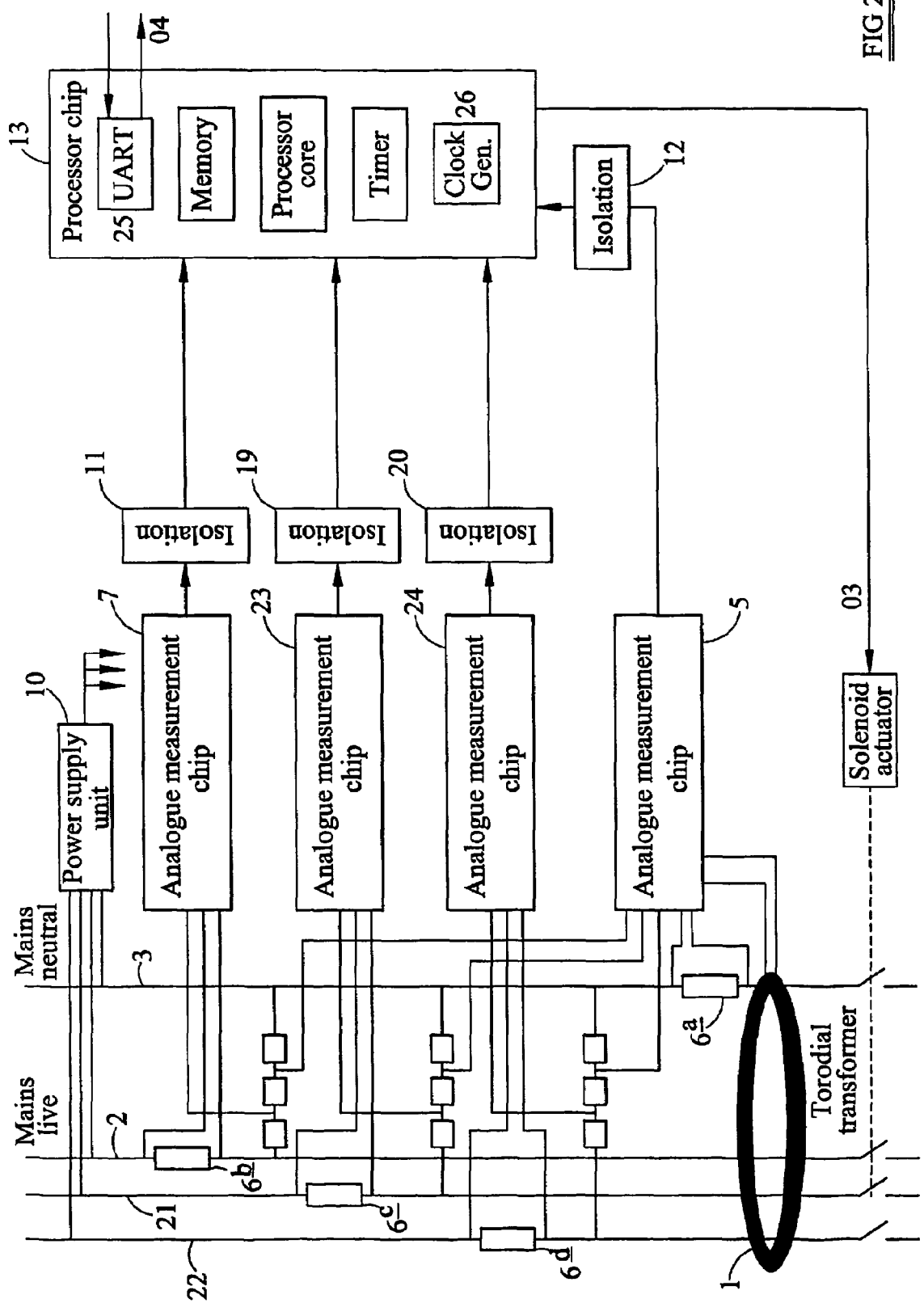
FIG. 2 is a block diagram of a combined power meter and residual current device embodying the present invention applied to a three phase electricity supply.

One structural configuration of a monitoring device embodying the present invention is shown in FIGS. 1 and 2. In a first aspect, FIG. 1 shows a single phase device in which a toroidal transformer core 1 is coupled to live and neutral conductors 2 and 3 respectively of an ac mains supply. A secondary coil 4 is wrapped around the core 1 and coupled to a first analog to digital converter 5 for generating a digital output O1 representative of the imbalance current sensed by the toroidal transformer 1.

A shunt detector means comprises a resistive shunt 6a provided in series with the mains neutral conductor 3. This may be of a resistive material such as manganin having a nominal resistance of 0.2 mΣ to a tolerance of less than 5%. Respective ends of the shunt 6a are connected to an analog to digital converter 7 which produces a digitised output O2 representative of the voltage drop across the shunt 6a. The voltage drop across shunt 6a provides a measure of the current flowing in the neutral conductor 3.

A resistor detector means comprises a potential divider having resistors 8a, 8b, 9 connected between the mains live and neutral conductors 2, 3 respectively. The voltage between these conductors can be determined by measuring the voltage drop across the resistor 8a by connecting respective ends of the resistor 8a to the second analog to digital converter 7. The digitised output O2 contains the information on the voltage across the resistor 8a.

A power supply unit 10 is provided for drawing power from the live and neutral mains conductors 2, 3 and for supplying controlled voltages to the analog to digital converters 5, 7 via isolation barriers 11, 12 and processor 13. A multi-plexer may be provided in each converter for providing to the processor, through the respective isolation barrier, signals representing both the current in the associated shunt and the voltage at one end of it. The processor 13 uses these signals to monitor the current in each shunt as well as the imbalance current sensed by the coil 4 of the toroidal transformer 1.

In the event of a current imbalance exceeding a predetermined threshold, the processor generates a trip signal O3 which drives a solenoid actuator 14 for breaking or tripping respective conductors 2, 3 via a circuit breaker indicated schematically by switches 15 and 16 in FIG. 1.

The processor 13 is also provided with a Universal Asynchronous Receiver Transmitter (UART) 25 as a means for generating and transmitting an output signal in the form serial data communications O4. The processor 13 provides output signals based on the current and voltage signals detected. This may include a power consumption signal based on power calculated from the detected current and voltage signals together with a time derived from a signal from a clock generator 26 within the processor 13.

Each one of the analog to digital converters comprises an analog to digital converter in the form of a delta-sigma modulator 17 which provides a high frequency one bit digital data stream. A temperature sensor 18 is provided so that the digitised output signals O1 and O2 are modified to compensate for temperature fluctuations. The modification may be effected by means of a calibration technique involving the use of a look up table (not shown). The temperature compensation may take the form of a polynomial fitted to calibration test results, the polynomial coefficients being stored in the look-up table.

In a second aspect, also shown in FIG. 1, the shunt detector means comprises a further shunt resistor 6b provided in series with the mains live conductor 2. Respective ends of the further shunt 6b are connected to analog to digital converter 5 such that digitised output O2 contains a digital signal representative of the voltage drop across the further shunt 6b. The voltage drop across further shunt 6b provides a measure of the current flowing in the live conductor 2. The processor 13 performs a comparison of the detected currents in the live and neutral conductors 2, 3 to detect a residual current. A residual current not detected by the toroidal transformer 1, for example a dc residual current or a saturating residual current, will be detected by the shunt detector, from which the processor 13 generates trip signal O3.

The resistors 8a, 8b and 9 that comprise the resistor detector means provide an additional voltage signal by connecting respective ends of the resistor 8b to the first analog to digital converter 5. The digitised output O1 contains the information on the voltage across the resistor 8b. The resistors 8a, 8b, across which connections are made to provide the voltage signals, are precision resistors of relatively low ohmic value, while the intermediate resistor 9 has a relatively high ohmic value. The ratio of the voltages measured across precision resistors 8a 8b should remain constant. By monitoring this ratio, an independent reference is provided, so that if the ratio changes over time due to drift in the analog to digital converter 5 or its references, an adjustment can be made by software within processor 13 to correct the value of the measured voltage.

FIG. 2 shows a three phase arrangement in which features similar to those of FIG. 1 have a same reference numeral. In this case, the ac supply has two additional live conductors 21, 22 for the second and third supply phases respectively. Two additional analog to digital converters 14, 15 are provided for the additional two phases. These generate outputs representative of the sensed current and voltage for the second and third phases respectively and supply these to the processor 13 via isolation barriers 19 and 20. In the arrangement of FIG. 2, the shunt detector means comprises resistive shunt 6a in the mains neutral conductor 3, and resistive shunts 6b, 6c, 6d in each of the mains live conductors 2, 21, 22 respectively. It is noted that the voltage sensing connections to analog to digital converters 23 and 24 are made via resistor chains connected between each phase line and the neutral in a similar manner to the resistors 8a, 8b and 9 of FIG. 1.

In both FIG. 1 and FIG. 2, the processor 13 is programmed to carry out the necessary calculations to determine the existence of an imbalance. It is also programmed to determine the current and voltage in respect of each phase to a high degree of precision for a subsequent power measurement. These measurements may be analysed in order to detect one or more other operating conditions including arc fault, standing current leakage, True power measurement. This information is useful for diagnostic purposes.

Figure 3:
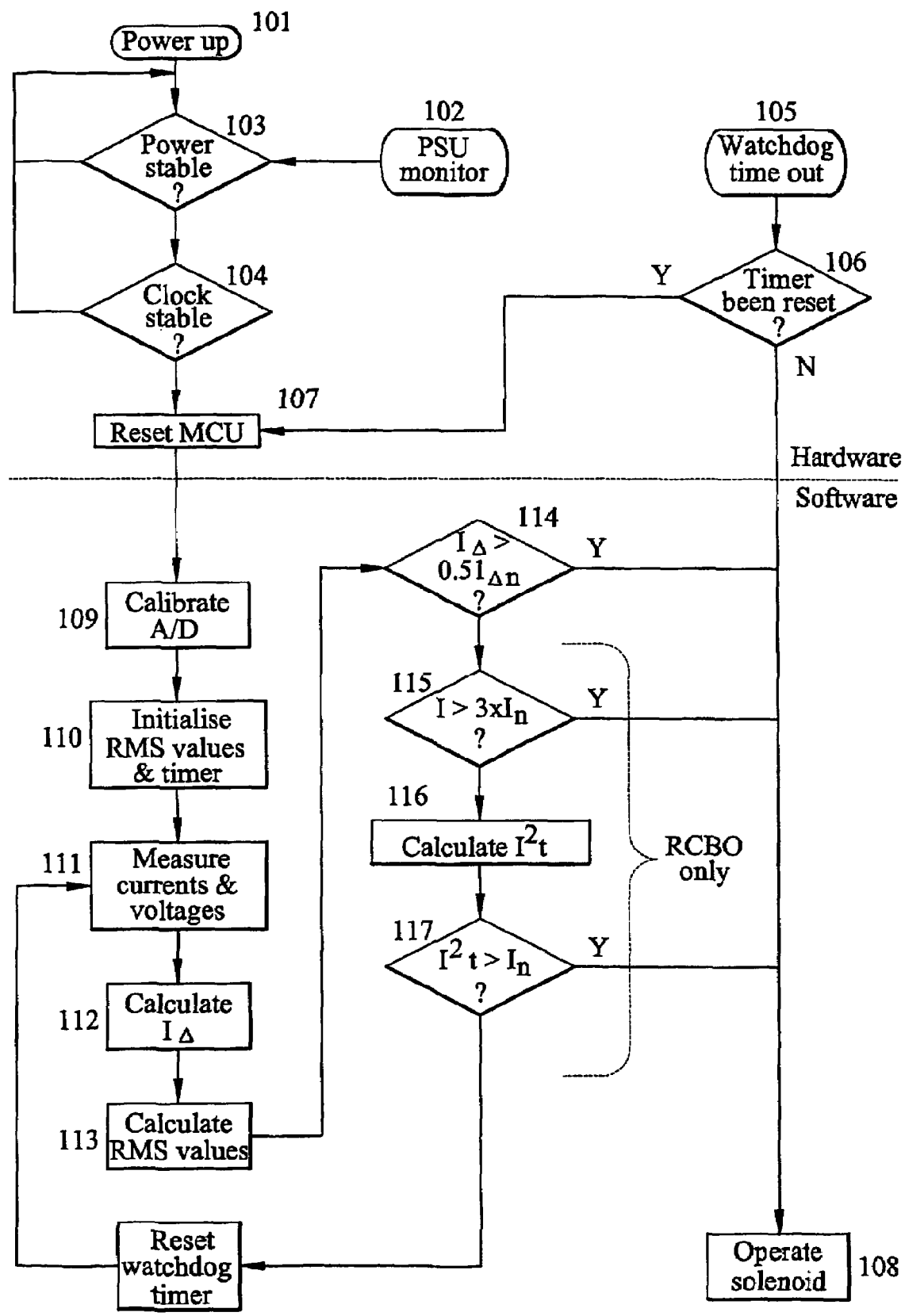
FIG. 3 is a flow chart indicating an operating sequence for residual current detection in a device embodying the present invention.

Referring to FIG. 3, the operating procedure of a monitoring device includes certain functions that are performed by hardware components and others that are performed by a software program in the processor which comprises a microcontroller unit (MCU). At step 101 the power supply is activated. Various checks are performed by the hardware to ensure that the supply is not switched on in the presence of a large residual current. A power supply unit monitor 102 checks that the power supply is stable, if not the device waits until the supply is stable before proceeding to step 104 where a check is made that the clock in the MCU is stable. Once stability has been confirmed buy these checks the MCU is reset at step 107. If the checks at steps 103 and 104 do not confirm stability such that the MCU is reset within a predetermined time, then at step 105 a watchdog timeout 106 provides a signal to operate a solenoid at step 108 that isolates the power supply.

Once the MCU has been reset, software in the MCU performs a calibration of the analog to digital converters at step 109. The calibration uses predetermined criteria so that the analog current and voltage signals measured are converted into digital signals representing the currents/voltages with the required precision.

Operating standards to which residual current devices are required to comply are usually defined in terms of RMS current values. Therefore the processor calculates the RMS values of the voltages and currents detected. To evaluate an RMS value accurately, the calculation must be performed over a full signal cycle or an integer multiple of signal cycles. This may be done by using a known supply frequency, or by measuring the supply frequency, for example by performing a Fourier analysis on a sample of measured values. Alternatively the RMS calculation may be peformed over a specific time interval which contains an integer multiple of cycles for all rated operating frequencies. In either case, at step 110 the MCU must initialise the RMS values and timing means.

A new RMS value can be calculated for each input waveform cycle or after each instantaneous measurement. The former method obtains a new RMS value every cycle and the latter after every measurement sample. The latter method is preferred as it gives a faster response time to any suddenly appearing residual current or overcurrent. In either case it takes at least 20 ms (rated frequency=50 Hz) to obtain the first RMS value. This is a significant portion of the time allowed for tripping on power up in the presence of a residual current, so it may be advantageous to have a specific routine at power up which looks at instantaneous values rather than RMS.

Many mains measurement systems sample at frequencies to include the $31^{st}$ harmonic. Allowing for operation up to 60 Hz and a frequency tolerance of ±5% gives a minimum sampling frequency of 3906 Hz, so a sampling frequency of 4 KHz is often used, and this would seem a good basis for initial design. However, to ensure an integer number of samples at both rated mains frequencies of 50 Hz and 60 Hz a sampling frequency of 3.9 Khz or 4.2 KHz is preferred.

The MCU, at step 111, evaluates the currents and voltages from the detected signals, at step 112 calculates the residual current I, and at step 113 calculates the RMS values.

At steps 114 to 117 the MCU performs various calculations and comparisons for determining whether an unsafe condition in the form of a residual current or other predefined condition exists. In the presence of an unsafe condition a trip signal is generated so as to operate the solenoid at step 108 to isolate the supply. The calculations and comparisons performed will depend on the type of residual current device employed. For example the comparisons shown at steps 115 and 117 would only be suitable for use with a residual current operated circuit-breaker having overcurrent protection (RCBO).

Examples of the parameters calculated by the MCU include the following:

Primary Measurement Quantities

Instantaneous line and neutral current at 4.2 KHz, $i_{1s}$, $i_{2s}$, $i_{3s}$ and $i_{ns}$
Instantaneous line voltage at 4.2 KHz, $v_1$, $v_2$, & $v_3$
Instantaneous Temperature at 4.2 KHz $T_1$, $T_2$ $T_3$ & $T_n$
Instantaneous Residual Current at 4.2 KHz (Toroid) $i_{\Delta t}$, Secondary Measurement Quantities The secondary measurement quantities calculated by the MCU are defined as follows:

Instantaneous current, $i_{\Delta s}$, where this is the sum of the currents in all four shunts (n denoting neutral shunt)

$$i_{\Delta s} = i_{1s} + i_{2s} + i_{3s} + i_{ns}$$

Instantaneous line and neutral current squared, $i^2_{1s}$, $i^2_{2s}$, $i^2_{3s}$ and $i^2_{ns}$
Instantaneous line voltage squared, $v^2_1$, $v^2_2$, & $v^2_3$
Instantaneous power, $p_1$, $p_2$, $p_3$:

$$p_1 = i_{1s} \cdot v_1, \; p_2 = i_{2s} \cdot v_2 \text{ and } p_3 = i_{3s} \cdot v_3$$

RMS residual current $I_{\Delta s}$ (from shunts):

$$I_{\Delta s} = \sqrt{\frac{1}{N} \cdot \left( \sum_{j=1}^{N} (i_{\Delta s}(j))^2 \right)}$$

where j is the index of the sample point within a whole cycle.

RMS residual current $I_{\Delta t}$ (from Toroid):

$$I_{\Delta t} = \sqrt{\frac{1}{N} \cdot \left( \sum_{j=1}^{N} (i_{\Delta t}(j))^2 \right)}$$

where j is the index of the sample point within a whole cycle.

Total line and neutral current (from shunts) $I_{1s}$, $I_{2s}$, $I_{3s}$ and $I_{ns}$:

$$I_{1s} = \sqrt{\frac{1}{N} \cdot \left( \sum_{j=1}^{N} (i_{1s}(j))^2 \right)}$$

and similarly for $I_{2s}$, $I_{3s}$ and $I_{ns}$.

RMS line voltage $V_1$, $V_2$ and $V_3$:

$$V_1 = \sqrt{\frac{1}{N} \cdot \left( \sum_{j=1}^{N} (v_1(j))^2 \right)}$$

RMS real power $P_1$, $P_2$ and $P_3$:

$$P_1 = \sqrt{\frac{1}{N} \cdot \left( \sum_{j=1}^{N} (v_1 \cdot i_{1s})^2 \right)}$$

RMS total power $W_1$, $W_2$ and $W_3$ where $W_1 = I_{1s} \cdot V_1$
Phase angle for each line $\phi 1$, $\phi 2$ and $\phi 3$:

$$\phi_1 = a\cos\left(\frac{P_1}{W_1}\right)$$

In the definition of all secondary RMS quantities, N is the number of 4.2 KHz output words in a line voltage cycle. N=84 for 50 Hz line frequency and N=70 for 60 Hz.

The invention claimed is:

1. A measuring device for an electrical installation having an AC supply via a neutral conductor and at least one live conductor, the device comprising a toroidal transformer detector for generating a residual current signal in response to a detected residual current in said electrical installation, a shunt resistor detector for generating respective current signals indicative of current detected in said neutral conductor and each of said at least one live conductors, a processor means for generating a trip signal indicative of the presence of a residual current fault in dependence on said residual current signal and/or said respective current signals detected, and a circuit breaker operative to break said AC supply in response to said trip signal.

2. A measuring device according to claim 1, further comprising resistor detector means for connection between said neutral and live conductors and operative for providing a signal representative of the voltage between said neutral and live conductors by measurement of the voltage drop across said resistor detector means or a potentially divided portion thereof.

3. A measuring device according to claim 1, wherein the processor means comprise a first analog to digital converter coupled to a secondary winding of said transformer for generating said residual current signal as a digital signal representative of the voltage sensed across the winding and/or the current in the winding.

4. A measuring device according to claim 3, wherein the first analog to digital converter includes a multiplexer for selectively coupling two or more of said detector means and generating corresponding digital signals representative of the voltage or current detected.

5. A measuring device according to claim 3, further comprising a second analog to digital converter coupled to the shunt resistor detector for generating digital signals representative of the current flowing through said neutral conductor and each of said at least one live conductors.

6. A measuring device according to claim 5, wherein the second analog to digital converter is coupled to said resistor detector means for generating digital signals representative of the voltage between said neutral and live conductors.

7. A measuring device according to claim 5, wherein the second analog to digital converter includes a multiplexer for selectively coupling two or more of said detector means and generating corresponding digital signals representative of the voltage or current detected.

8. A measuring device according to claim 6, including a microprocessor for determining the power consumed by the electrical installation and operative for generating a current imbalance signal indicative of the residual current during real time from the residual current signal, and operative for generating a trip signal on the basis of a comparison of the current imbalance signal with a predetermined threshold criterion.

9. A measuring device according to claim 1 comprising a communication device for transmitting monitoring information to a remote station.

10. A combined toroid/shunt device for detecting a residual current in an electrical installation comprising a plurality of conductors, the device comprising: a toroid means for detecting an AC residual current lying within a first range; a plurality of resistive shunts for connection in respective ones of said plurality of conductors; and current detection means responsive to current flowing in each of said shunts for detecting a DC residual current and/or an AC residual current lying within a second range.

11. A combined toroid/shunt device according to claim 10 wherein the first range of AC residual current is an AC residual current resulting from earth leakage or cross-leakage between the conductors up to a saturation level at which the toroid or electronic means associated therewith become saturated, and the second range includes AC residual currents above said saturation level.

12. A combined toroid/shunt device according to claim 10, wherein the conductors comprise a live conductor and a neutral conductor.

13. A measuring device for an electrical installation comprising a plurality of conductors, the device comprising toroid means for detecting a residual current and power consumption means comprising a shunt detector means for generating a current signal indicative of current detected in at least one of said conductors and a resistor detector means for generating a voltage signal indicative of voltage across at least one pair of said conductors.

14. A measuring device according to claim 13, wherein the toroid means comprises a toroidal transformer detector for detecting a residual current signal in response to a detected residual current in said electrical installation, and said resistor detector means is provided for connection between neutral and live conductors of said electrical installation to generate said voltage signal by measuring the voltage drop across the resistor means or a potentially divided portion thereof, the device further comprising a processor means for generating a trip signal indicative of the presence of a residual current fault in dependence on said residual current signal, and an output signal derived from said current and voltage signals to facilitate determination of power consumption.

15. A measuring device according to claim 14, wherein the shunt detector means comprises a respective shunt connected in series in each of a plurality of phases of an AC current supply, each phase comprising a supply via a phase live conductor and said neutral conductor, wherein the shunt detector means is operative for providing a respective current signal indicative of the current flowing in the respective phase live conductor for each phase of the AC supply, and said resistor detector means comprises a respective resistor means connected between each of said phase live conductors and said neutral conductor, said processor being operative for generating signals representative of the voltage between each phase live conductor and said neutral conductor by measuring the voltage across each of said resistor means or potentially divided portions thereof.

* * * * *